(12) United States Patent
Nagata et al.

(10) Patent No.: US 6,356,173 B1
(45) Date of Patent: Mar. 12, 2002

(54) HIGH-FREQUENCY MODULE COUPLED VIA APERTURE IN A GROUND PLANE

(75) Inventors: Koichi Nagata; Kenji Kitazawa; Shinichi Koriyama, all of Kokubu; Shigeki Morioka, Gamou-cho; Takanori Kubo, Kokubu; Hidehiro Minamiue, Kokubu; Masanobu Ishida, Kokubu; Akira Nakayama, Kokubu; Naoyuki Shino, Kokubu, all of (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/322,739

(22) Filed: May 28, 1999

(30) Foreign Application Priority Data

| May 29, 1998 | (JP) | ......................... 10-149377 |
| May 29, 1998 | (JP) | ......................... 10-149378 |
| Sep. 29, 1998 | (JP) | ......................... 10-276199 |
| Sep. 29, 1998 | (JP) | ......................... 10-276200 |

(51) Int. Cl.$^7$ ............................................. H01P 5/02
(52) U.S. Cl. ...................... 333/247; 333/260; 257/664; 257/728
(58) Field of Search .............................. 333/24 R, 246, 333/247, 260; 327/565; 257/664, 725, 728

(56) References Cited

U.S. PATENT DOCUMENTS 3,771,075 A    11/1973   Phelan
4,768,004 A  * 8/1988   Wilson ........................ 333/246
5,206,712 A  * 4/1993   Kornrumpf et al. .... 333/247 X
5,450,046 A  * 9/1995   Kosugi et al. ............. 333/246
5,808,519 A  * 9/1998   Gotoh et al. ............ 333/247 X
5,952,709 A  * 9/1999   Kitazawa et al. ........... 257/664
6,002,375 A  * 12/1999  Corman et al. ......... 333/247 X
6,023,210 A  * 2/2000   Tulintseff ................ 333/246 X

FOREIGN PATENT DOCUMENTS

| EP | 0-671-777 | 9/1995 | |
| JP | 54-131-851 | 10/1979 | |
| JP | 61-123-302 | 6/1986 | |
| JP | 310203 | * 12/1988 | ................ 333/247 |
| JP | 07-263-887 | 10/1995 | |
| WO | WO98/02025 | 1/1998 | |

* cited by examiner

*Primary Examiner*—Benny Lee
(74) *Attorney, Agent, or Firm*—Hogan & Hartson L.L.P.

(57) ABSTRACT

A high-frequency module in which a plurality of cavities are formed on the surface of a dielectric board, internal high-frequency signal transmission lines are connected to high-frequency devices in the cavities and are located in the cavities, the internal high-frequency signal transmission lines being electromagnetically coupled to the external high-frequency signal transmission line, and the high-frequency devices in the cavities are connected to each other relying on the electromagnetic coupling through the external line. The high-frequency module enables high-frequency signals to be transmitted among the high-frequency devices with a small loss. The module has a very simple structure, and is cheaply produced, and offers an advantage that it can be easily obtained in a small size.

9 Claims, 6 Drawing Sheets

HIGH-FREQUENCY MODULE COUPLED VIA APERTURE IN A GROUND PLANE

BACKGROUND OF THE INVENTION

1. Field of the Invention

The present invention relates to a high-frequency module on which are mounted a plurality of high-frequency devices that are operated by high-frequency signals of from a microwave band to a millimeter wave band. More specifically, the invention relates to a high-frequency module capable of transmitting signals among the high-frequency devices without deteriorating the characteristics of high-frequency signals.

2. Description of the Prior Art

In the conventional high-frequency packages mounting high-frequency devices that are operated by high-frequency signals of microwaves or millimeter waves, high-frequency devices are contained in the cavities hermetically closed by walls or closures connected to the surface of a dielectric substrate, and signal transmission lines are electrically connected to the high-frequency devices. The signal transmission lines are electrically connected to signal transmission lines formed on an external circuit board such as mother board, so that high-frequency signals are input to, and output from, the high-frequency devices.

FIG. 11A illustrates a general structure of such a high-frequency module, wherein cavities 43, 43' are formed on the surface of a dielectric board 41 and are air-tightly closed by closures 42, 42'. High-frequency devices 44, 44' are mounted in the cavities 43, 43'. On the surface of the dielectric board 41 in the cavities are formed high-frequency signal transmission lines 45, 45' such as strip lines connected to the high-frequency devices 44, 44'. The transmission lines 45, 45' are connected, through connection conductors 48 such as wires or ribbons to a conductor layer 47 which is insulated by an insulating block 46 formed at the ends of the closures 42, 42'. A portion of the conductor layer 47 is connected, through the connection conductor 48, to a transmission line formed on the surface of the dielectric board 41 on the outside of the cavity. That is, the input and output of high-frequency signals to and from the high-frequency devices 44, 44' from the external side and the input and output of high-frequency signals between the high-frequency devices 44, 44', are accomplished through the conductor layer 47 and the transmission lines 45, 45'.

There have further been proposed high-frequency modules of structures shown in FIGS. 11B and 11C.

In the high-frequency module of FIG. 11B, for example, a signal transmission line 49 is formed in a dielectric board 41 and is electrically connected to transmission lines 45, 45' that are connected to high-frequency devices 44, 44' via a through-hole conductor 50. That is, the input and output of high-frequency signals between the high-frequency devices 44, 44', or the input and output of high-frequency signals to and from the high-frequency devices 44, 44' from the external side, is accomplished through the signal transmission line 49 and the through-hole conductor 50.

The high-frequency module of FIG. 11C has been proposed in Japanese Unexamined Patent Publication (Kokai) No. 263887/1995. In this module, each high-frequency device is independently and electromagnetically sealed by an electrically conducting closure, a metal plate 51 is provided on the back surface of the dielectric board, and a dielectric layer is laminated on the back surface of the metal plate 51. A through-hole is formed penetrating from the front surface of the dielectric board through up to the dielectric layer of the back surface of the metal plate 51. In the through-hole, there are provided through-hole conductors 52, 52' connected to the input/output terminals of the high-frequency devices on the side of the dielectric board, and through-hole conductors 53, 53' on the back surface of the metal plate 51 on the side of the dielectric layer, the through-hole conductors being connected together through coaxial transmission passages 54, 54' formed in the through-hole of the metal plate 51. The through-hole conductors 53, 53' on the side of the dielectric layer are further electrically connected to each other through a connection line 55 formed in the dielectric layer. That is, in this module, the high-frequency signals are input and output between the high-frequency devices through the coaxial transmission passages formed in the through-hole.

In the high-frequency module on which a plurality of high-frequency devices are mounted, it is basically requested that the high-frequency signals are input and output among the high-frequency devices without deteriorating the transmission characteristics of high-frequency signals and that the module is easily fabricated. However, the high-frequency modules of the structures shown in FIGS. 11A to 11C are not capable of satisfying such requirements to a sufficient degree.

In the high-frequency module of FIG. 11A, for example, the signal transmission line is transformed from a microstrip line into a strip line at a moment when a high-frequency signal passes through the conductor layer 47 and the walls of the closures 42, 42'. In order to accomplish the impedance matching, therefore, the width of the signal transmission line must be narrowed. As a result, the reflection loss or the radiation loss easily occurs when the signal passes through the walls of the closures 42, 42' causing the transmission characteristics of high-frequency signals to be deteriorated. To draw the signal transmission lines 45, 45' out of the cavities 43, 43', furthermore, the closures 42, 42' must be provided with dielectric members (insulating blocks 46) at the lower ends thereof (at portions where the conductor layer 47 passes through). Therefore, this module is complex in the structure driving up the cost of production.

In the high-frequency module of FIG. 11B, on the other hand, the high-frequency signals are input and output via the through-hole conductor 50; i.e., the signal transmission passage does not pass through the walls of the closures, and transmission characteristics of the signals are deteriorated little. In this case, however, the signal transmission passage is folded at portions where the signal transmission line 49 and the through-hole conductor 50 are connected together. When the frequency of signals exceeds 40 GHz, therefore, the transmission loss increases abruptly at the folded portions, making it difficult to transmit high-frequency signals of a frequency higher than 40 GHz.

In the high-frequency module of FIG. 11C, too, high-frequency signals are input and output through the coaxial lines 54, 54' provided in the through-hole, making it possible to decrease the transmission loss for the high-frequency signals. It is, however, difficult to form coaxial lines in the through-hole and, besides, reliability is low at the connection portions between the through-hole conductor and the coaxial lines.

SUMMARY OF THE INVENTION

It is therefore an object of the present invention to provide a high-frequency module in which a plurality of high-frequency devices are mounted on the surface of a dielectric board and are individually and electromagnetically sealed, featuring a small transmission loss in transmitting signals among the high-frequency devices, and having a simple structure that is easy to fabricate and a small size yet maintaining high reliability.

According to the present invention, there is provided a high-frequency module comprising:

a dielectric board;

a first cavity and a second cavity closed by closures joined to one surface of said dielectric board, the cavities being independent from each other;

high-frequency devices mounted on the surface of said dielectric board at positions in said first cavity and in said second cavity;

internal high-frequency signal transmission lines arranged on the surface of said dielectric board at positions in said first cavity and in said second cavity, the ends on one side thereof being electrically connected to said high-frequency devices; and an external high-frequency signal transmission line arranged on a region outside said first cavity and said second cavity; wherein the end on the other side of said internal high-frequency signal transmission line connected to said high-frequency device in said first cavity and the end on the other side of said internal high-frequency signal transmission line connected to said high-frequency device in said second cavity, are electromagnetically coupled to said external high-frequency signal transmission line, so that said high-frequency device in said first cavity and said high-frequency device in said second cavity are electrically connected together due to the electromagnetic coupling.

In the high-frequency module of the present invention, a striking feature resides in that the internal high-frequency signal transmission lines (internal lines) connected to the high-frequency devices mounted in the first and second cavities, are electromagnetically coupled to the external high-frequency signal transmission line (external line) formed on a region outside the cavities. By transmitting a high-frequency signal by such an electromagnetic coupling, the transmission loss can be reduced. That is, in the present invention, the internal lines formed in different cavities are connected together through an external line that is electromagnetically coupled thereto. Therefore, the connection portions do not pass through the walls of the closures and, besides, no through-hole conductors or coaxial lines are used for connecting them together. As a result, reflection loss or radiation loss can be reduced since the signals do not pass through the walls of the closures or through the folded portions, and high-frequency signals of a frequency not lower than, for example, 40 GHz can be transmitted among the high-frequency devices producing little transmission loss. Besides, no coaxial line needs be formed, and the structure is very simple. Therefore, the high-frequency module of the present invention is easy to produce and is very advantageous from the standpoint of reducing the size, too.

According to the present invention, the internal high-frequency signal transmission lines and the external high-frequency signal transmission line can be easily and electromagnetically coupled together by interposing a ground layer having slots between them via dielectric layers. That is, the dielectric layer is formed between the internal lines and the ground layer, and between the external line and the ground layer, respectively, and the ends of the internal lines (of the side not connected to the high-frequency devices) are opposed to the ends of the external line through the slots formed in the ground layer. Here, the internal lines are formed on the surface of the dielectric board. It is therefore allowed to electromagnetically couple the external line and the internal lines together by (a) a method in which the ground layer is formed in the dielectric board, and the external line is formed on the other surface (back surface) of the dielectric board, (b) a method in which the ground layer is formed on the back surface of the dielectric board, and a dielectric plate equipped with the external line is adhered onto the ground layer in a manner that the dielectric layer is positioned between the external line and the ground layer, or (c) a method in which the dielectric plate equipped with the external line and with the ground layer is adhered to the back surface of the dielectric board.

In the present invention, when a dielectric constant $\epsilon 1$ of a dielectric layer between the internal line and the ground layer is larger than a dielectric constant $\epsilon 2$ of a dielectric layer between the external line and the ground layer, the concentration of a magnetic field on the electromagnetic coupled portion can be increased and the transmission characteristics can be increased, and furthermore, mounting of the high-frequency device or an external circuit board can be easily performed.

According to the present invention, furthermore, it is desired to electromagnetically seal the external line in order to prevent the effect of external electromagnetic waves, to prevent the leakage of electromagnetic waves, and to prevent coupling with other signal transmission lines. This makes it possible to further decrease the transmission loss of the external line.

It is desired that the internal lines connected to the high-frequency devices in the cavities are constituted by microstrip lines, coplanar lines or grounded coplanar lines, and the external line on the outside of the cavities is constituted by a microstrip line, a coplanar line, a grounded coplanar line or a tri-plate line.

Furthermore, to reduce the transmission loss in the internal line and the external line, it is preferred that an interfacial electric conductivity in the adhesive surface between a conductor layer forming the lines or the ground layer and the dielectric board or the dielectric plate should be high.

DETAILED DESCRIPTION OF THE INVENTION

The invention will now be described in detail by way of an embodiment with reference to the accompanying drawings.

Figure 1:
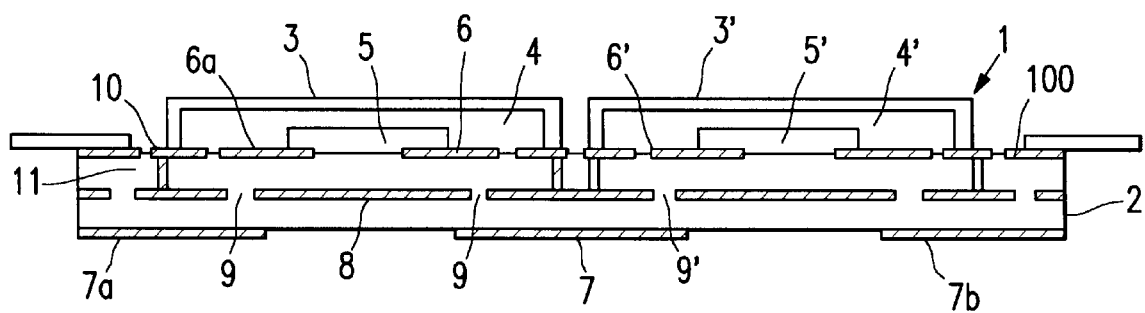
FIG. 1 is a side sectional view illustrating a high-frequency module according to a first embodiment of the present invention.

Referring to FIG. 1 illustrating a high-frequency module according to a first embodiment of the present invention, the module (generally designated at 1) has a dielectric board 2. A plurality of closures 3, 3' are joined to the surface of the dielectric board 2 thereby to form cavities (first cavity 4, second cavity 4') which are closed by these closures and are independent from each other. High-frequency devices 5, 5' such as MMIC, MIC or the like are mounted on the surface of the dielectric board 2 in the cavities 4, 4'. In the cavities 4, 4', high-frequency signal transmission lines (hereinafter often abbreviated as internal lines) 6, 6' are formed on the surface of the dielectric board 2 and are electrically connected to the high-frequency devices 5, 5'. It is desired that the high-frequency devices 5, 5' are directly mounted on the internal lines 6,6' by the so-called flip-chip mounting method from the standpoint of decreasing the transmission loss. It is, however, also allowable to electrically connect the high-frequency devices 5, 5' to the internal lines 6, 6' by bonding wires, by using gold ribbons or by using conductor members obtained by forming a conductor layer of copper or the like on an insulating substrate of polyimide or the like.

In FIG. 1, a ground layer 8 is provided in the dielectric board 2 nearly over the whole area thereof in parallel with the internal lines 6, 6', the ground layer 8 having slots 9, 9' formed at positions corresponding to the ends of the internal lines 6, 6' (ends of the side not connected to the high-frequency devices, hereinafter referred to as open ends). On the back surface of the dielectric board 2 (surface of the side where no cavity is formed), there are formed an external high-frequency transmission line (hereinafter often abbreviated as external line) 7 for connecting the internal lines 6, 6' together. As shown, the external line 7 extends in parallel with the internal lines 6, 6' and the ground layer 8. The end on one side of the external line 7 is opposed to the open end of the internal line 6 in the first cavity 4 through the slot 9, and the end on the other side of the external line 7 is opposed to the open end of the internal line 6' in the second cavity 4' through the slot 9'. (Another circuit such as an external circuit may be connected to the internal line 6a via the external line 7a)

That is, the open end of the internal line 6 and the end on one side of the external line 7 are electromagnetically coupled together through the slot 9, and high-frequency signals are transmitted between the two lines 6 and 7 producing a small transmission loss. Similarly, the open end of the internal line 6' and the end on the other side of the external line 7 are electromagnetically coupled together through the slot 9', and high-frequency signals are transmitted between the two lines 6' and 7 producing a small transmission loss. In the high-frequency module 1 as described above, the high-frequency device 5 and the high-frequency device 5' are connected together via the internal line 6, external line 7 and internal line 6' producing a small loss.

Figure 2:
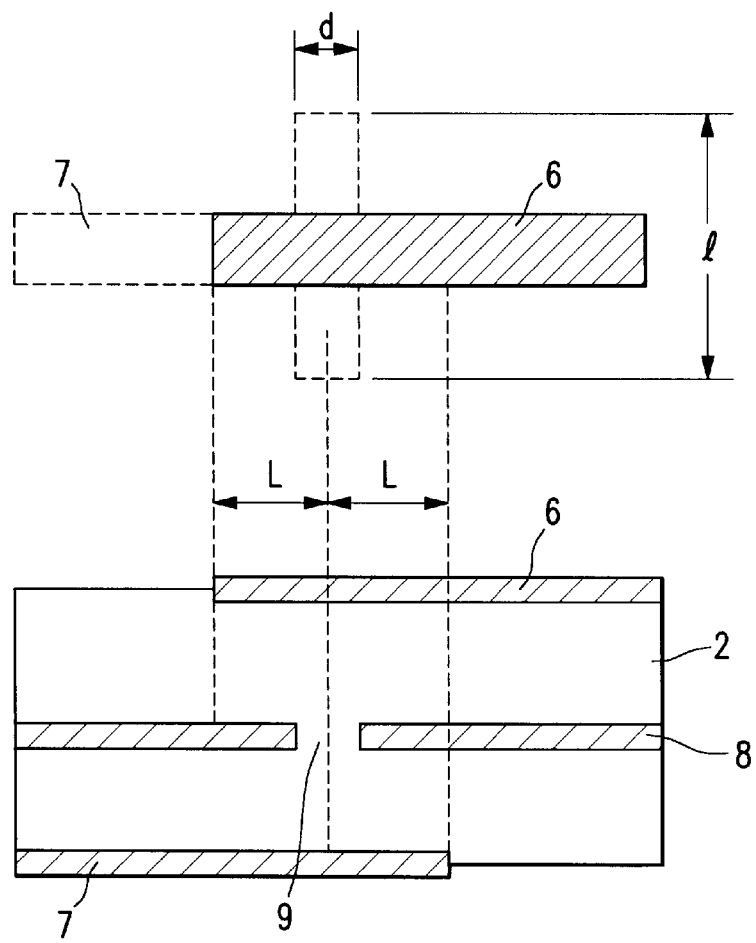
FIG. 2 is a view schematically illustrating a positional relationship between the ends of internal or external high-frequency signal transmission lines and the slots of the ground layer in the module of FIG. 1.

Referring to FIG. 2 illustrating the structure of electromagnetically coupling the internal line 6 and the external line 7 together, the slot 9 has a rectangular shape with its long side 1 intersecting the internal line 6 and the external line 7 at right angles. The distance L between the ends of the lines and the center of the slot 9 has been set to be nearly one-fourth the wavelength of the transmission signals. The size of the slot 9 is suitably set depending upon the frequency of the signals and the band width of the frequencies. In general, the long side 1 is nearly one-half the wavelength of the transmission signals, and the short side d is one-fifth to one-fiftieth the wavelength of the transmission signals. The slot 9 is not limited to the rectangular shape only, as a matter of course, and may be of an elliptic shape. In this case, it is desired that the long axis of the ellipse satisfies the condition related to the long side 1 and the short axis satisfies the condition related to the short side d. Though FIG. 2 illustrates the structure for electromagnetically coupling the internal line 6 and the external line 7 together, the structure is quite the same for electromagnetically coupling the internal line 6' and the external line 7 together.

In the high-frequency module 1 of the present invention, it is desired that the comprises a dielectric material having a dielectric constant of not larger than 20, such as ceramics, e.g., alumina, mullite, silicon nitride, silicon carbide or aluminum nitride, or glass ceramics, ceramics-metal composite material glass-organic resin composite material, organic resin, or quartz.

The closures 3, 3' can be constituted by using an electromagnetic wave-shielding material capable of preventing the leakage of electromagnetic waves from the interior of the first and second cavities 4, 4' to the exterior, such as metal, electrically conducting ceramics or ceramics-metal composite material. However, the closures may be made of an insulating substrate coated with an electrically conducting substance on the surface thereof. Generally, it is desired to use the metallic closure from the viewpoint of cost. It is further desired to form an electrically conducting layer 10 on the junction portions between the closures 3, 3' and the dielectric board 2, so that the conductor layer 10 and the ground layer 8 are electrically connected together through a via-hole conductor 11. Upon providing the conductor layer 10 and the via-hole conductor 11, it is allowed to more effectively shield the electromagnetic waves in the cavities 4, 4', to prevent the electromagnetic waves generated by the high-frequency devices 5, 5' and the internal lines 6, 6' from leaking to the external side, and to prevent the external electromagnetic field from adversely affecting the high-frequency devices. Thus, the circuit is effectively prevented from malfunctioning, and the module exhibits markedly improved reliability. Moreover, an electromagnetic wave-absorbing member may be attached to the inner surfaces of the closures 3, 3' so that resonance from the internal-lines 6, 6' will not affect other circuits.

In the cavities 4, 4', there may be provided, on the surface of the dielectric board 2, power source lines for supplying electric power to the high-frequency devices 5, 5' and low-frequency signal transmission lines (not shown) for transmitting low-frequency signals of not higher than 1 GHz. Moreover, other electronic parts may be mounted, as required. These lines and electronic parts are guided out of the cavities 4, 4' through the via-hole conductors and through-holes, and are further guided out of the module 1 relying upon the widely known multi-layer wiring board technology.

On the surface of the dielectric board 2 on the-side of cavities 4, 4', furthermore, there may be provided other high-frequency signal transmission lines 100 at positions on the outside of the cavities 4, 4', in order to connect the internal lines 6, 6' to the other lines 100 by utilizing the above-mentioned electromagnetic coupling to the external line 7.

In the present invention as described earlier, it is desired that the internal lines 6, 6' are constituted by microstrip lines, coplanar lines or grounded coplanar lines, and the external line 7 is constituted by a microstrip line, a coplanar line, a grounded coplanar line or a tri-plate line. Furthermore, the internal lines 6, 6', external line 7 and ground layer 8 can be formed of a low-resistance conductor such as Ag, Cu or Au, a high-melting metal such as W or Mo, an alloy thereof, or a known conducting material. In particular, it is desired that the internal lines 6, 6' are formed by using a low-resistance conductor such as Ag, Cu or Au. It is therefore desired that the dielectric substrate 2 is made of glass ceramics fired at a temperature of from about 800 to about 1000° C. Use of such glass ceramics makes it possible to form the internal lines 6, 6' of a low-resistance conductor and the dielectric board 2 at one time by the co-firing.

According to the present invention, the above-mentioned structure for electromagnetically coupling the internal lines 6, 6' and the external line 7 together, is formed by interposing the ground layer 8 having slots 9, between them via dielectric layers. In the embodiment of FIG. 1, the ground layer 8 and the external line 7 are provided on the dielectric board 2. However, the ground layer 8 or the external line 7 may be provided on a member separate from the dielectric board 2 as shown in FIG. 3 or 4.

Figure 3:
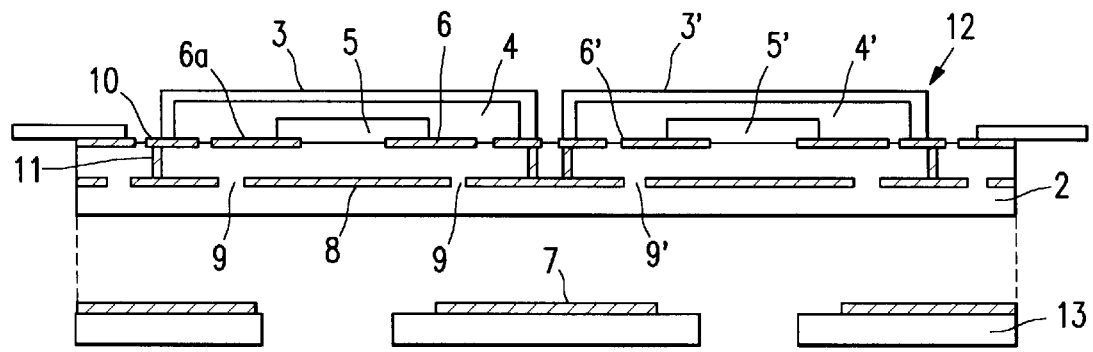
FIGS. 3 and 4 are side sectional views illustrating, in a disassembled manner, the module of the present invention in which a ground layer or an external line is provided on a member separate from the dielectric board.

In a module of FIG. 3 (generally designated at 12), for example, the ground layer 8 having slots 9, 9' is provided in the dielectric board 2, but the external line 7 is provided on a dielectric plate 13 separate from the dielectric board 2. That is, there are prepared a plurality of dielectric plates 13 having the external line 7 formed on the surfaces thereof, and these dielectric plates 13 are stuck to the back surface of the dielectric board 2 in a manner that the ends of the external line 7 are opposed to the ends of the internal lines 6, 6' through the slots 9, 9' in the ground layer 8, thereby to form the electromagnetic coupling structure similar to that of FIG. 1.

Figure 4:
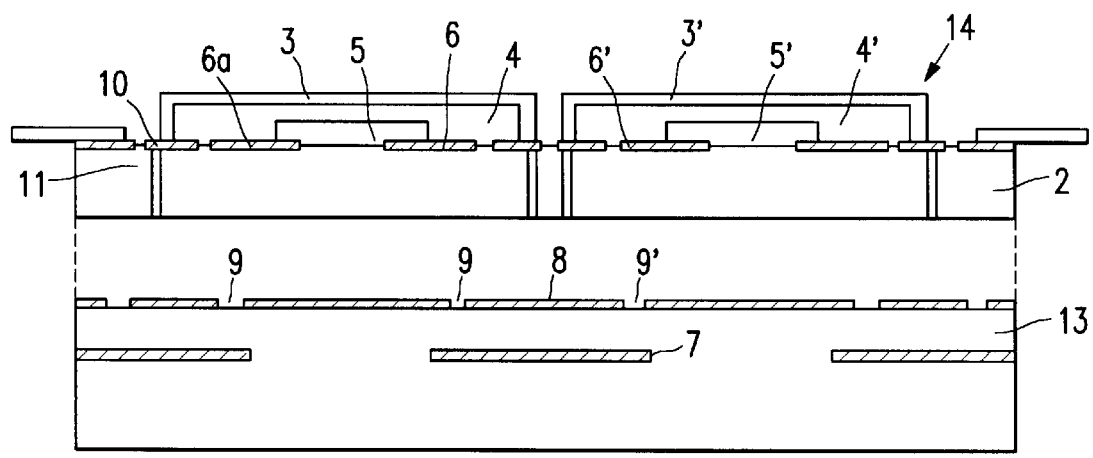

In a module of FIG. 4 (generally designated at 14), neither the ground layer 8 nor the external line 7 is formed on the dielectric board 2. The ground layer 8 having slots 9, 9' is formed on the whole surface of the dielectric plate 13 separate from the dielectric board 2, and the external line 7 is formed in the dielectric plate 13. The dielectric plate 13 on the side of the ground layer 8 is stuck to the back surface of the dielectric board 2, thereby to form the electromagnetic coupling structure similar to that of FIG. 1.

In the embodiments of FIGS. 3 and 4, the dielectric plate 13 can be secured to the back surface of the dielectric board 2 by using an adhesive, glass or screws. However, the dielectric plate 13 may be simply superposed on the back surface of the dielectric board 2 without using adhesive. It is further desired that the dielectric plates 13 of FIGS. 3 and 4 are made of a dielectric material and, particularly, a resin having a dielectric constant smaller than that of the dielectric material constituting the dielectric board 2 from the standpoint of improving the electromagnetic coupling between the internal lines 6, 6' and the external line 7. Furthermore, these dielectric plates 13 may also work as a heat sink or a housing. The structure of the dielectric plate 13 is not limited to the one shown in FIG. 3 or 4, but may take any other form provided the ground layer 8 is formed between the internal lines 6, 6' and the external line 7 via dielectric layers. In the embodiment of FIG. 3, for example, the external line 7 may be formed in the dielectric plate 13 or on the back surface thereof. In the embodiment of FIG. 4, the ground layer 8 may be formed in the dielectric plate 13, or the external line 7 may be formed on the back surface of the dielectric plate 13.

(Shielding Structure)

In the high-frequency module of the present invention described above, it is desired that the external line 7 is electromagnetically shielded. Embodiments of the shielding structure are shown in FIGS. 5 to 7.

Figure 5:
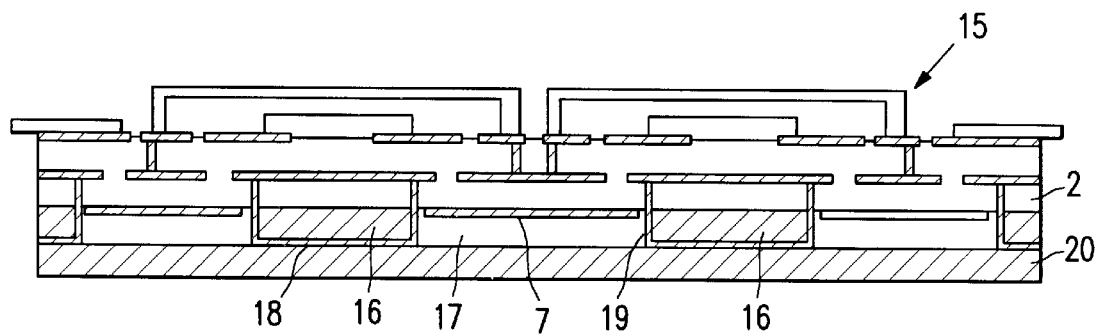
FIGS. 5 to 7 are views illustrating means for electromagnetically shielding the external high-frequency signal transmission line provided in the high-frequency module of the present invention.

In a high-frequency module 15 of FIG. 5, a frame 16 having an opening 17 and a thickness larger than the thickness of the external line 7 is attached to the back surface of the dielectric board 2, i.e., attached to the external line-forming surface. The external line 7 provided on the back surface of the dielectric board 2 is positioned in the opening 17 of the frame 16, and is surrounded by the frame 16. Furthermore, a conductor layer 19 is formed on the side wall of the opening 17 of the frame 16, and is electrically connected to the ground layer 8 via a castellation (not shown) and a via-hole conductor. An electrically conducting closure 20 is secured to the frame 16 via the ground layer 18, and the opening 17 is completely closed by the closure 20. The external line 7 is completely surrounded by the conductor layer 19 provided on the side wall of the opening 17 and by the electrically conducting closure 20, and is electromagnetically shielded.

In this embodiment, it is desired that the frame 16 is formed of a dielectric material and, particularly, the one having a dielectric constant of not larger than 20, such as ceramics, glass ceramics, ceramics-metal composite material, glass-organic resin composite material or organic resin. It is most desired that the frame 16 is made of a dielectric material quite the same as the dielectric material constituting the dielectric board 2 to prevent the occurrence of distortion due to thermal expansion. Like the above-mentioned closures 3, 3' shielding the cavities 4, 4', the electrically conducting closure 20 is constituted by an electromagnetic wave-shielding material such as metal, electrically conducting ceramics or ceramics-metal composite material. The frame 16 and the closure 20 can be attached by using an adhesive or screws. The ground layer 18 may be omitted.

Figure 6:
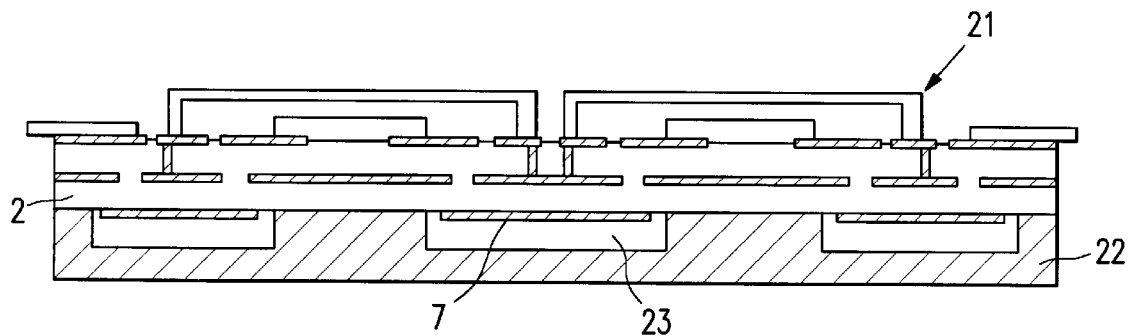
Figure 7:
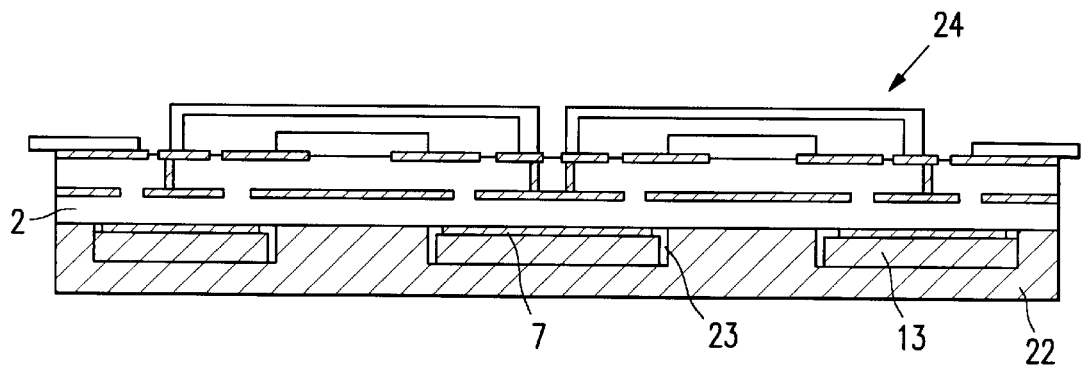

In a high-frequency module of FIG. 6, an electrically conducting closure 22 having a recess 23 is provided instead of the frame 16 and closure 20 of the high-frequency module 15 of FIG. 5. That is, the electrically conducting closure 22 is secured to the back surface of the dielectric board 2 by using an adhesive or screws, and the external line 7 is positioned in the recess 23 of the electrically conducting closure 22. Therefore, the external line 7 is completely surrounded by the electrically conducting closure 22 and is electromagnetically shielded.

In a high-frequency module 24 of FIG. 7, the external line 7 is attached to the dielectric board 2 by using the dielectric plate 13 shown in FIG. 3, and is shielded by the electrically conducting closure 22 used in FIG. 6. In this module 24, the dielectric plate 13 must have a size that can be accommodated in the recess 23 of the electrically conducting closure 22, and has a thickness nearly equal to, or slightly smaller than, the depth of the recess 23. In FIGS. 6 and 7, the electrically conducting closure 22, is made of an electromagetic wave-shielding material same as that of the electrically conducting closure 20 of FIG. 5.

The external line 7 is electromagnetically shielded in a manner as shown in FIGS. 5 to 7, whereby the electromagnetic waves generated by the external line 7 is prevented from leaking to the external side, the external electromagnetic field is effectively prevented from adversely affecting the external line 7, a circuit incorporating the high-frequency module is effectively prevented from malfunctioning, and the high-frequency module features markedly enhanced reliability.

In the present invention described above, the ground layer 8 is formed between the internal lines 6, 6' and the external line 7, and the dielectric layer is necessarily made present between the internal lines 6, 6' and the ground layer 8 and between the external line 7 and the ground layer 8 irrespective of the method of forming these lines and ground layer. According to the present invention, it is desired that the dielectric layer (hereinafter referred to as internal line side-dielectric layer) between the internal lines 6, 6' and the ground layer has a dielectric constant $\epsilon 1$ larger than a dielectric constant $\epsilon 2$ of the dielectric layer (hereinafter referred to as external line side-dielectric layer) between the external line 7 and the ground layer 8.

For example when the dielectric constant $\epsilon 1$ of the internal line side-dielectric layer is small, the width of the internal lines 6, 6' must be increased to match the impedance with the external line side-dielectric layer. In other words, it is difficult to finely form the internal lines 6, 6' and, hence, the junction surfaces to the semiconductor elements 5, 5' (such as Ga—As having the dielectric constant of about 13) occupy increased areas, resulting in an increase in the size of the module or, depending upon the cases, making it difficult to connect the internal lines 6, 6' to the semiconductor elements 5, 5'.

When the dielectric constant $\epsilon 2$ of the external line side-dielectric layer is large, on the other hand, the width of the external line 7 must be very narrowed on a portion where the high-frequency module is mounted on an external circuit board (such as a mother board having the dielectric constant of 2 to 3) by extending the external line 7, or the thickness of the external line side-dielectric layer must be increased, in order to match the impedance with the external circuit board. If the width of the line is narrowed, tolerance for positioning decreases at the time of mounting, making it difficult to accomplish the mounting maintaining a high precision. When the thickness of the external line side-dielectric layer is increased, on the other hand, the magnetic field is not concentrated on the electromagnetically coupled portions, and the transmission characteristics are deteriorated. Moreover, transmission characteristics are deteriorated due to propagation of higher-order mode. For example, when the external line side-dielectric layer has a thickness of 250 $\mu$m, in the case of the dielectric constant $\epsilon 2$ of 8 to 9, propagation of a higher-order mode occurs at frequencies of 60 to 70 GHz or higher, and in the case of the dielectric constant $\epsilon 2$ is 5 to 6, propagation of a higher-order mode occurs at frequencies of 110 GHz or higher.

In the present invention, the dielectric constant $\epsilon 1$ of the internal line side-dielectric layer is selected to be larger than the dielectric constant $\epsilon 2$ of the external line side-dielectric layer, making it possible to decrease the width of the internal lines 6, 6' connected to the high-frequency devices 5, 5' and, hence, to reduce the areas of the surfaces on where the high-frequency devices are mounted, offering great advantage from the standpoint of decreasing the size of the module. It is further allowed to decrease the thickness of the external line side-dielectric layer, enabling the magnetic field to be concentrated on the electromagnetically coupled portions and, hence, making it possible to improve the transmission characteristics. It is, further, allowed to suppress the deterioration in the transmission characteristics caused by the higher-order mode propagation that occurs in a high-frequency band. It is therefore allowed to use signals of higher frequencies. When the high-frequency module is to be mounted on the external circuit board by extending the external line 7, it is allowed to increase the width of the external line 7 on the mounting portion and, hence, to broaden the tolerance for positioning at the time of mounting, making it possible to easily accomplish the mounting.

According to the present invention, therefore, it is desired that the dielectric constant $\epsilon 1$ of the internal line side-dielectric layer is $5<\epsilon 1 \leq 15$ and, particularly, $5<\epsilon 1 \leq 10$, and the dielectric constant $\epsilon 2$ of the external line side-dielectric layer is $\epsilon 2 \leq 7$ on condition that $\epsilon 2<\epsilon 1$.

The dielectric constant of the dielectric layer can be easily adjusted by suitably selecting the dielectric material for forming the dielectric layer. A high dielectric constant is exhibited by a dielectric layer containing a ceramic filler in large amounts, such as $Al_2O_3$, $SiO_2$, quartz, mullite, barium titanate, calcium titanate and aluminum nitride. A small dielectric constant is exhibited by a dielectric layer containing a glass component in large amounts, such as borosilicate glass like zinc borosilicate glass or lead borosilicate glass, or alkalisilicate glass. The dielectric constant of the dielectric layer can be thus adjusted. Furthermore, the external line side-dielectric layer may be made of an organic resin for forming an external circuit board such as a mother board.

According to the present invention, furthermore, it is desired that the above-mentioned internal lines 6, 6', external line 7 and ground layer 8 are so formed that a high interfacial electric conductivity is exhibited on the surface on where the conductors constituting the above lines and ground layer are adhered to the dielectric layer. In particular, the high-frequency signal transmission characteristics can be further enhanced by increasing the interfacial electric conductivity on the surface where the conductor constituting the internal lines 6, 6' or the external line 7 is adhered to the dielectric layer. That is, when a ground layer and a conductor line are formed with the dielectric layer being sandwiched therebetween and high-frequency signals are transmitted through an electromagnetic field established between the ground layer and the conductor line, the signals tend to concentrate on the interface between the conductor line and the dielectric layer. When the electric resistance is great on the interface between the conductor line and the dielectric layer, therefore, the transmission loss of high-frequency signals increases. According to the present invention, the interfacial electric conductivity is increased on the surfaces on where the conductor constituting the internal lines 6, 6', external line 7 or ground layer 8 and the dielectric layer are adhered together, in order to effectively suppress the transmission loss.

To increase the interfacial electric conductivity, the surfaces of the dielectric layer on where the lines and ground layer are formed should be smoothed to a high degree; e.g., the surface roughness (Ra)(JIS B0601) should be not larger than 1.0 $\mu$m, particularly, not larger than 0.9 $\mu$m and, most desirably, not larger than 0.8 $\mu$m. When the surface of the dielectric layer is coarse, the path of a current that flows on the surface of the conductor becomes long and the resistance increases, and it becomes difficult to increase the interfacial electric conductivity.

To set the surface roughness of the dielectric layer to lie within the above-mentioned range, the surface of the dielectric layer should be polished in the case when the lines and the ground layer are formed after the dielectric layer has been formed. When the dielectric layer and the lines are simultaneously formed by the so-called co-firing, it is desired that the dielectric layer is formed by using a ceramic material that is capable of forming a smoothly fired surface. As such a ceramic material, it is desired to use a glass ceramics or a high-purity alumina ceramics among the above-mentioned materials for forming the dielectric board. In particular, it is most desired to use a high-purity alumina ceramics containing alumina in an amount of not less than 98% and, particularly, not less than 99% from the standpoint of developing a small dielectric loss in a high-frequency region. It is further desired that the ceramics powder used for forming the dielectric layer has an average crystalline particle diameter of from 0.5 to 3 µm.

The interfacial electric conductivity can be increased by suitably selecting the kind of the conductor and the forming conditions depending upon the method of forming the lines and the ground layer.

For example, a representative method of forming the lines and the ground layer include a thick film method and a thin film method.

According to the thick film method, a paste (conducting paste) containing a conducting powder is applied onto the surface of the dielectric layer in the shape of a predetermined circuit pattern by screen printing, etc. followed by firing, in order to form a conductor layer in the shape of a desired pattern. In this case, a co-firing method can be employed in which the conducting paste is applied to a ceramic green sheet that has not been fired, and the green sheet and the past are simultaneously fired.

The thin-film method is the one (vapor-phase method) in which a conducting layer of a predetermined wiring pattern is formed on the dielectric layer by vaccum evaporation, sputtering, CVD, ionic plating or laser abrasion via a mask, the one (plating method) in which a conducting film is formed on the surface of the dielectric layer by plating and the conducting film is patterned into the lines by photolithography, or the one (transfer method) in which a metal foil is formed on a transfer sheet by plating, the metal foil is patterned into lines by photolithography, and the wiring pattern is transferred onto the dielectric layer. The thin-film method is effective in forming the internal lines 6, 6' or the external line 7. By using the above-mentioned thick-film method, for example, the dielectric board 2 having the ground layer 8 is formed, and the internal lines 6, 6' or the external line 7 are formed on the front surface or the back surface of the dielectric board 2 relying on the above-mentioned thin-film method.

When the internal lines 6, 6', external line 7 or ground layer 8 is formed by the thick-film method, it is desired that the conductor layer that is formed has a thickness of from 0.5 to 30 µm, particularly, from 0.5 to 25 µm and, most desirably, from 0.5 to 10 µm. When the thickness of the conductor layer is smaller than the above-mentioned range, the layer exhibits an increased electric resistance, which makes it difficult to increase the interfacial electric conductivity and causes an increase in the transmission loss in the conductor layer constituting these lines and ground layer. When the thickness of the conductor layer increases in excess of the above-mentioned range, the side surfaces of the conductor layer are slackened or coarsened causing the dimensional precision to decrease. As a result, the transmission loss increases, signals are dispersed due to the electromagnetic coupling, the conductor layers are damaged or deformed at the time of laminating, and the distance is not maintained uniform between the ground layer 8 and the internal lines 6, 6' or the external line 7, resulting in a mismatching of impedance.

The conducting paste is prepared by dispersing an electrically conducting powder in a suitable solvent. Here, it is desired that the conducting powder has an average particle diameter of from 0.5 to 4 µm. When the average particle diameter is smaller than the above-mentioned range, the portions through where the electric current passes decrease in the conductor layer that is formed, or the electrically conducting powder is easily oxidized depending on its kind (e.g., Cu). As a result, the electric resistance of the conductor layer (particularly, the surface) increases, making it difficult to increase the interfacial electric conductivity. When the average particle diameter of the electrically conducting powder is larger than the above-mentioned range, on the other hand, smoothness is lost on the surface of the conductor layer that is formed. For instance, the surface roughness (Ra) becomes greater than 0.5 µm, the path of a current becomes long and the resistance increases, making it difficult to increase the interfacial electric conductivity. The conducting paste is often blended with ceramic components in order to bring the coefficient of thermal expansion into agreement between the conductor layer and the dielectric layer, or is blended with a glass frit to enhance the intimate adhesiveness between the two. Addition of such high-resistance components causes the interfacial electric conductivity to decrease. It is therefore desired that these components are added in an amount of not larger than 10% by weight.

As described above, the surface roughness of the dielectric layer is adjusted, and the internal lines 6, 6', external line 7 or ground layer 8 are formed by the thick-film method, making it possible to increase the interfacial electric conductivity on the surfaces on where the conductor layer forming them and the dielectric layer are adhered together and, hence, to further improve the transmission characteristics. When the conductor layer is formed of a high-melting metal such as W, Mo or Mn, or an alloy thereof, the interfacial electric conductivity becomes not smaller than $0.4 \times 10^7 \ \Omega^{-1} \cdot m^{-1}$ at 13 GHz. When the conductor layer is formed by using Cu, Ag or an alloy thereof, furthermore, it is desired that the dielectric layer has a surface roughness (Ra) of not larger than 0.8 µm, more preferably, not larger than 0.5 µm and, most preferably, not larger than 0.3 µm. Then, the conductor layer that is formed exhibits an interfacial electric conductivity of not smaller than $3 \times 10^7 \ \Omega^{-1} \cdot m^{-1}$ at 13 GHz.

When the internal lines 6, 6', external line 7 and ground layer 8 are formed by the thin-film method, the conductor layer is little slackened unlike that of the case of the thick-film method; i.e., the conductor layer is formed having excellent smoothness and favorable dimensional precision. It is therefore desired that the thickness of the conductor layer is set to be nearly equal to that of when the thick-film method is employed. Depending upon the cases, however, the thickness can be increased up to about 50 µm. In the case of the thin-film method, it is desired that the dielectric layer has a surface roughness (Ra) which is not larger than 0.5 µm, more preferably, not larger than 0.3 µm, and most preferably, not larger than 0.2 µm in order to enhance the intimate adhesiveness between the conductor layer that is formed and the dielectric layer. In order to enhance the intimate adhesiveness, furthermore, a buffer film composed of a compound of a metal compound such as Ta, Ti, Ni, Cr or Pd may be formed on the surface of the dielectric layer. In the thin-film method, it is desired to use a low-resistance metal such as Cu, Ag or Au ab a conducting material. In this case, the conductor layer forming the lines on the ground layer exhibits an interfacial electric conductivity of not smaller than $3.5 \times 10^7$ $\Omega^{-1} \cdot m^{-1}$ and, particularly, not smaller than $4.0 \times 10^7$ $\Omega^{-1} \cdot m^{-1}$ at 12 GHz. This can increase the transmitting characteristics of a high-frequency signal.

When the internal lines 6, 6', external line 7 and ground layer 8 are formed by either the thick-film method or the thin-film method using copper as a conductor, it is desired that the surfaces are plated with Au or the like to prevent oxidation.

The interfacial electric conductivity can be measured by the dielectric rod resonance method.

In this rod resonance method, there is used a dielectric resonator which is formed by attaching a dielectric substrate having a metallic surface layer onto both end surfaces or onto one end surface of a dielectric rod. The dielectric rod is made of a dielectric material of which the dielectric constant and the dielectric tangent have been known. That is, by using such a dielectric resonator, the electric conductivity on the interface between the metallic layer and the dielectric substrate, i.e., the interfacial electric conductivity of the metallic layer is measured.

The measuring method is based on the following principle. That is, an electromagnetic field resonator is constituted by using a dielectric rod having a predetermined dimensional ratio (height t/diameter d) and by attaching two conductor plates which are parallel to each other onto both end surfaces of the dielectric rod. Therefore, the dielectric rod is sandwiched between two conductor plates. These conductor plates are so large that their edge effect can be neglected (usually, the conductor plates having a diameter D about three times as great as the diameter d of the dielectric rod). In such a electromagnetic field resonator, a high-frequency current that flows into the conductor plate in the $TE_{omn}$ resonance mode is distributed on the short-circuiting surfaces only, i.e., distributed on only the interfaces between the dielectric rod and the conductor plate.

Figure 8:
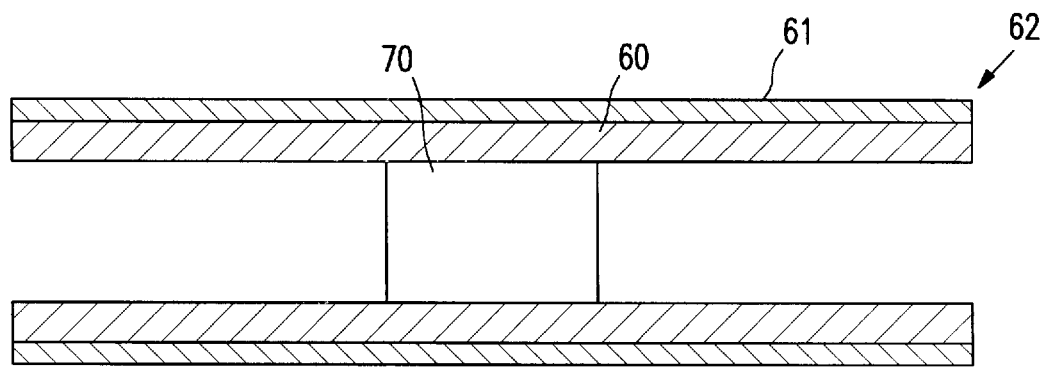
FIG. 8 is a diagram illustrating the structure of a dielectric rod resonator for measuring the interfacial electric conductivity on the surfaces where the conductor layers and the dielectric layer are adhered together.

Referring, for example, to FIG. 8, a dielectric resonator is assembled by sandwiching a dielectric rod 70 between two pieces of boards 62 which are obtained by forming a conductor layer 61, of which the interfacial electric conductivity is to be measured, on the surface of a dielectric layer 60. As will be obvious from FIG. 8, both ends of the dielectric rod 70 are in contact with the dielectric layers 60.

In the dielectric resonator, a high-frequency current that flows into the conductor layer 61 in the $TE_{omn}$ mode (m=1, 2, 3, - - -, n=1, 2, 3, - - -) is distributed on only the interface between the conductor layer 61 and the dielectric layer 60. Therefore, the interfacial electric conductivity $\sigma_{int}$ can be calculated from the resonance frequency $f_0$ and unloaded Q; Qu [in the measured $TE_{omn}$ mode (m=1, 2, 3, - - -, n=1, 2, 3, - - -)] in compliance with the following formula (1), $$\sigma_{int} = [A/(1/Qu - B_1 \tan \delta_1 - B_2 \tan \delta_2)]^2 \quad (1)$$

where A, $B_1$ and $B_2$ are calculated from the following formulas (2), (3) and (4), $$A = \sqrt{\frac{\mu}{8\omega}} \int\int |H|^2 ds / W^e \quad (2)$$

$$B_1 = W_{d1}^e / W^e \quad (3)$$

$$B_2 = W_{d2}^e / W^e \quad (4)$$

where $\tan \delta_1$ and $\tan \delta_2$ of the formula (1) are dielectric tangents of the dielectric rod 70 and dielectric layer 60, $\mu$ is a permeability of the conductor layer 61, $\omega$ is $2\pi f_0$, $\int\int |H|^2 dS$ is an integration of a magnetic field in the interface of the conductor layer, $W^e$ is electric field energy of the resonator, $W_{d1}^e$ is electric field energy in the dielectric rod 70 and $W_{d2}^e$ is electric field energy in the dielectric layer 60.

Dielectric constants $\delta'_1$ and $\delta'_2$, $\tan \delta_1$ and $\tan \delta_2$ of the dielectric rod 70 and of the dielectric layer 60 necessary for the calculation of $W^e$, $W_{d1}^e$ and $W_{d2}^e$ are measured relying upon the dielectric rod resonator method disclosed in JIS-R-1627 or the cavity resonator method disclosed in Kobayashi, Sato, et. al., "Shingakugiho MW87-7", 1987.

As the dielectric rod 70 of FIG. 8, there can be used sapphire (having a diameter d=10.000 mm and a height t=5.004 mm) having end surfaces perpendicular to the C-axis.

The interfacial electric conductivity is measured in a manner as described above.

The above-mentioned high-frequency module of the present invention can be modified and changed in various ways.

In the embodiments of FIGS. 1 to 7, for example, the first cavity 4 and the second cavity 4' are formed on the same dielectric board 2. They, however, may be formed on different dielectric boards. That is, the closure 3, cavity 4, high-frequency device 5 and internal line 6 may be formed on the dielectric board 2, and the closure 3', cavity 4', high-frequency device 5' and internal line 6' may be formed on another dielectric board. So far as the electromagnetic coupling is not impaired, furthermore, a known matching circuit or various electronic parts may be connected to the portions where the external line 7 is connected to the internal lines 6, 6'.

Figure 9A:
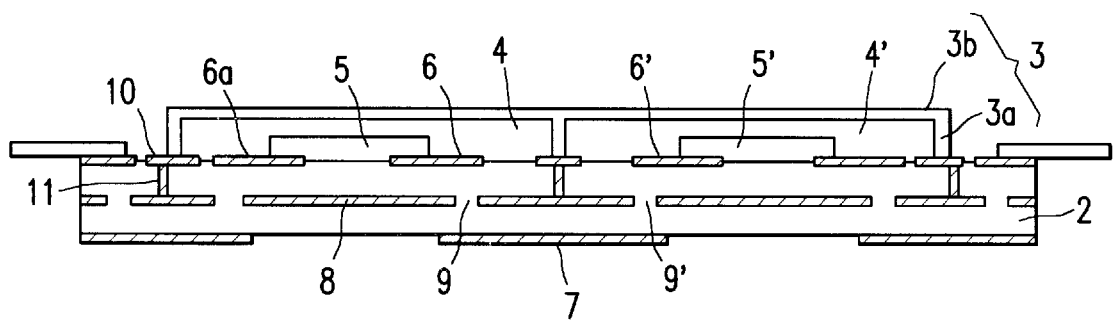
FIGS. 9A and 9B are views illustrating embodiments in which a closure forming a first cavity and a closure forming a second cavity are molded together as a unitary structure.
Figure 9B:
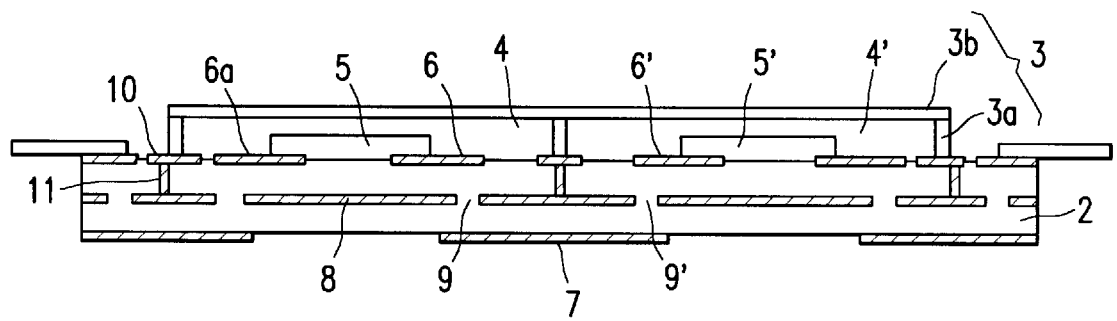

Furthermore, the first cavity 4 and the second cavity 4' may be electromagnetically independent from each other, and need not be formed by different closures. For example, the closures 3, 3' may be those that are molded together as a unitary structure. FIGS. 9A and 9B illustrate embodiments in which the closure for forming the first cavity 4 and the closure for forming the second cavity 4' are molded as a unitary structure.

In FIG. 9A, the first cavity 4 and the second cavity 4' are partitioned by the closure 3 that is molded as a completely unitary structure. That is, the closure 3 comprises a plurality of side walls 3a and a ceiling panel 3b formed integrally with the side walls 3a. Space in the closure 3 is partitioned by the side walls 3a into the first cavity 4 and the second cavity 4'. In FIG. 9B, the closure 3 comprises a plurality of side walls 3a and a ceiling panel 3b like in the case of FIG. 9A. In this case, however, the side walls 3a are separate from the ceiling wall 3b. The piece of ceiling panel 3b is attached to the upper ends of the plurality of side walls 3a with an adhesive In the embodiments of FIGS. 1 to 7, two cavities 4, 4' were formed on the surface of the dielectric board 2. It is, however, also allowable to form three or more cavities on the surface of the dielectric board 2. In this case, the high-frequency devices in the cavities can be connected to each other by electromagnetically coupling the above-mentioned internal lines and the external line together, or there may be mounted independent high-frequency devices that are not connected to the high-frequency devices in other cavities.

Furthermore, a waveguide can be connected to the high-frequency module of the present invention in order to transmit high-frequency signals from the high-frequency devices directly to an antenna element.

Figure 10:
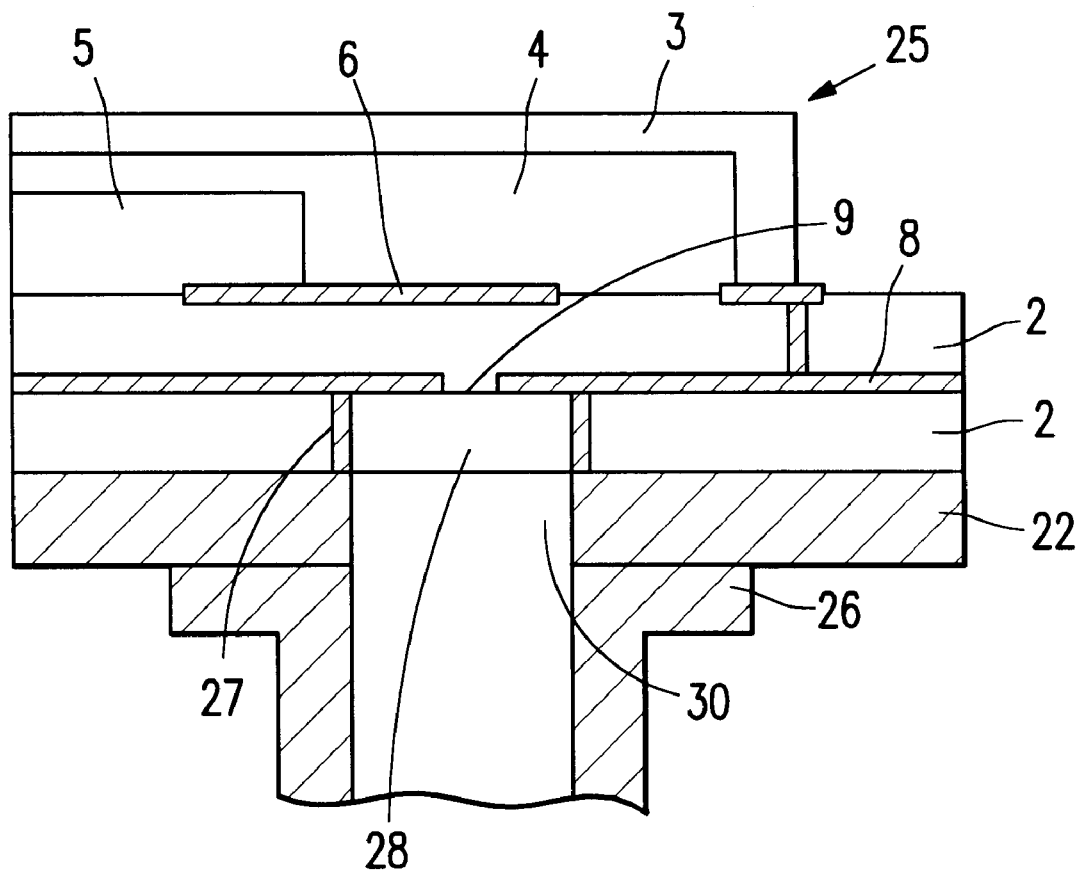
FIG. 10 is a view illustrating a structure for connecting the high-frequency module and a waveguide together according to the present invention.
Figure 11A:
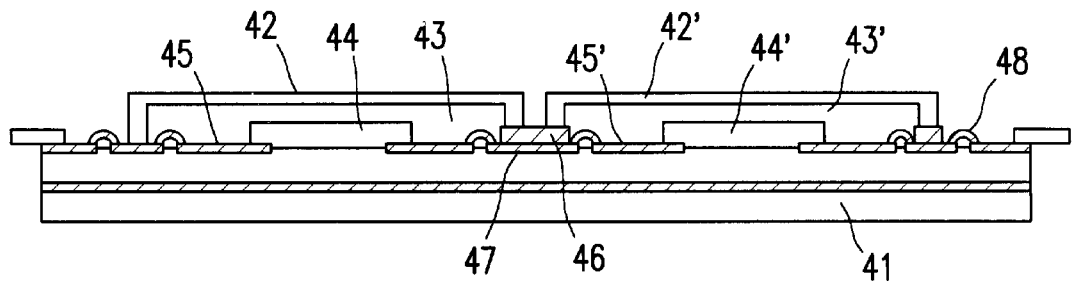
FIGS. 11A to 11C are views illustrating the structures of conventional high-frequency modules.
Figure 11B:
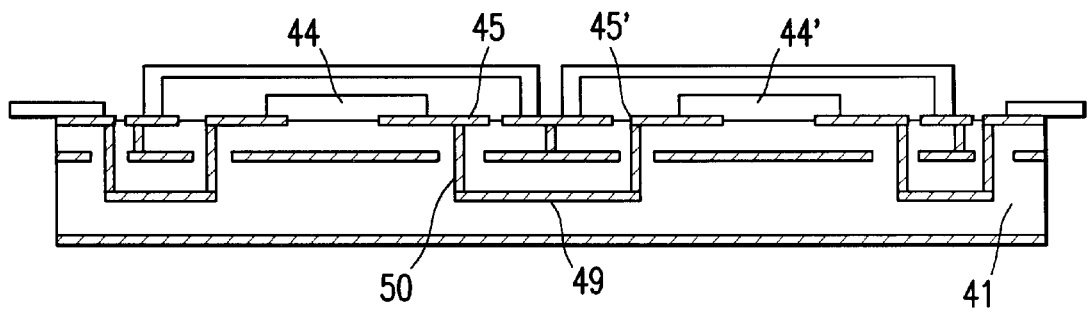
Figure 11C:
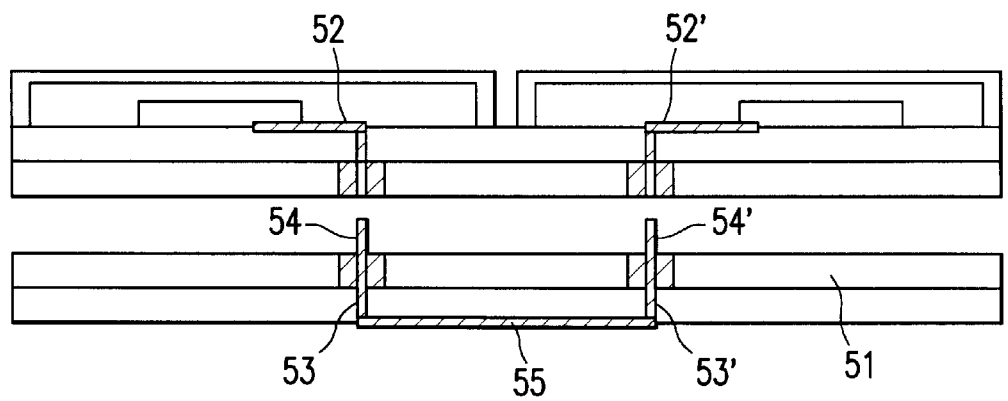

FIG. 10 illustrates a structure for connecting the high-frequency module of the invention shown in FIG. 6 to the waveguide.

In FIG. 10, an electrically conducting closure 22 is stuck to the back surface of the dielectric board 2, the electrically conducting closure 22 having an opening 30 formed therein. An end of the waveguide 26 is attached to the electrically conducting closure 22 with an electrically conducting adhesive. As will be obvious from FIG. 10, internal space (signal transmission space) of the waveguide 26 is in agreement with the opening 30. A slot 9 is formed in the ground layer 8 of the dielectric board 2 at a position to be opposed to the center of the opening 30. Over the slot 9, an open end of the internal line 6 connected to the high-frequency device 5 is positioned so as to be electromagnetically coupled thereto. Moreover, via-hole conductors 27 are provided in the dielectric board 2, the via-hole conductor 27 extending along the signal transmission space and opening 30 of the waveguide 26 and being connected to the ground layer 8. The via-hole conductors 27 are arranged so as to surround the slot 9. Usually, it is desired that the via-hole conductors 27 are arranged maintaining a gap smaller than one-fourth the wavelength of the high-frequency signals that are to be transmitted, in order to effectively prevent the leakage of electromagnetic waves into portions other than the waveguide 26. A dielectric layer 28 for impedance matching is formed in space in the dielectric board 2 (on the side connected to the waveguide 26) surrounded by the via-hole conductors 27.

Owing to this connection structure, the waveguide 26 is electromagnetically coupled through the slot 9 to the internal line 6 connected to the high-frequency device 5 at an end of the module 25. Upon connecting other modules or an antenna element to the waveguide 26, it becomes possible to transmit high-frequency signals from the high-frequency device 5 to these members producing a low loss.

What is claimed is:

1. A high-frequency module comprising:

a dielectric board;

first and second cavities closed by closures joined to an upper surface of said dielectric board, the cavities being independent from each other;

first and second high-frequency devices mounted on the upper surface of said dielectric board at positions in said first and second cavities, respectively;

first and second high-frequency signal transmission lines arranged on the upper surface of said dielectric board at positions in said first and second cavities, respectively, and having first ends electrically connected to respective high-frequency devices;

a third high-frequency signal transmission line disposed on a lower surface of said dielectric board; and an electrically conductive member mounted on the lower surface of said dielectric board and electromagnetically shielding said third high-frequency signal transmission line;

wherein a second end of said first high-frequency signal transmission line and a second end of said second high-frequency signal transmission line are electromagnetically coupled to said third high-frequency signal transmission line, whereby said first and second high-frequency devices are coupled to transmit high-frequency signals therebetween.

2. A high-frequency module according to claim 1, wherein the first, second, and third high-frequency signal transmission lines are formed of a structure selected from the group consisting of microstrip lines, coplanar lines, grounded coplanar lines and triplate lines.

3. A high-frequency module according to claim 1, further comprising:

a fourth high-frequency signal transmission line disposed on the upper surface of said dielectric board outside said first and second cavities and adapted to be connected to an external circuit, said fourth high-frequency signal transmission line being electromagnetically coupled to said third high-frequency signal transmission line for transmitting a high-frequency signal between said first or second high-frequency devices and said external circuit.

4. A high-frequency module according to claim 1, further comprising a ground layer having slots provided in the dielectric board, wherein the second end of the first high-frequency signal transmission line and the second end of the second high-frequency signal transmission line are electromagnetically coupled to the third high-frequency signal transmission line via the slots of the ground layer.

5. A high-frequency module according to claim 4, wherein the dielectric board is formed of at least two laminated dielectric layers, and the ground layer is disposed on an interface of two of the dielectric layers.

6. A high-frequency module according to claim 5, wherein an interfacial electric conductivity of a surface between a dielectric layer and the first, second, or third high-frequency signal transmission line or the ground layer is not smaller than $3.5 \times 10^7 \ \omega^{-1} \cdot m^{-1}$ at 12 GHz.

7. A high-frequency module according to claim 5, wherein a dielectric constant $\delta 1$ of a dielectric layer between the first or second high-frequency signal transmission line and the ground layer is larger than a dielectric constant $\delta 2$ of a dielectric layer between the third high-frequency signal transmission line and the ground layer.

8. A high-frequency module according to claim 5, wherein an interfacial electric conductivity of a surface between a dielectric layer and the first, second, or third high-frequency signal transmission line or the ground layer is not smaller than $0.4 \times 10^{17} \ \Omega^{-1} \cdot$ at 13 GHz.

9. A high-frequency module according to claim 5, wherein an interfacial electric conductivity of a surface between a dielectric layer and the first, second, or third high-frequency signal transmission line or the ground layer is not smaller than $3 \times 10^7 \ \Omega^{-1} \cdot m^{-1}$ at 13 GHz.

* * * * *